United States Patent
Ishimaru

(10) Patent No.: US 6,625,185 B2
(45) Date of Patent: Sep. 23, 2003

(54) OPTICAL MODULE PRODUCING METHOD AND OPTICAL MODULE

(75) Inventor: Tomohisa Ishimaru, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 144 days.

(21) Appl. No.: 09/964,583

(22) Filed: Sep. 28, 2001

(65) Prior Publication Data

US 2002/0039373 A1 Apr. 4, 2002

(30) Foreign Application Priority Data

Sep. 29, 2000 (JP) .................................. 2000-299144

(51) Int. Cl.[7] ............................................... H01S 3/02
(52) U.S. Cl. ........................................... 372/36; 438/26
(58) Field of Search ................................ 372/36; 438/25, 438/26, 27

(56) References Cited

U.S. PATENT DOCUMENTS

| 4,380,862 | A | * | 4/1983 | Nyul ............................ 438/26 |
| 6,087,194 | A | | 7/2000 | Matsukura et al. ............ 438/25 |
| 6,376,268 | B1 | * | 4/2002 | Verdiell ........................ 438/26 |
| 6,404,065 | B1 | * | 6/2002 | Choi ............................. 257/782 |

FOREIGN PATENT DOCUMENTS

JP      2000-121889       4/2000

* cited by examiner

Primary Examiner—James Davie
(74) Attorney, Agent, or Firm—Oblon, Spivak, McClelland, Maier & Neustadt, P.C.

(57) ABSTRACT

The present invention provides a optical module comprising a semiconductor laser diode for outputting a laser beam; a first carrier on which the semiconductor laser diode is fixedly mounted; a photodiode for receiving a monitoring laser beam outputted from the back face of the semiconductor laser diode; a second carrier on which the photodiode is fixedly mounted; and a base on which the first and second carriers are fixedly mounted through soldering. At least one soldering sheet for soldering the first and second carriers on the base is fixedly pre-mounted on the base in place through spot welding.

8 Claims, 5 Drawing Sheets

OPTICAL MODULE PRODUCING METHOD AND OPTICAL MODULE

BACKGROUND OF THE INVENTION

The present invention relates to a method of producing optical modules including a semiconductor laser module used in the field of optical communication and so on, and a optical module.

Recently, the semiconductor laser diode has broadly been used as a signaling light source or as an optical-fiber amplifier pump light source, in the optical communication. Where the semiconductor laser diode is used as a signaling or pump light source in the optical communication, it is often used as a semiconductor laser module which is a device for optically coupling the laser beam outputted from the semiconductor laser diode with the optical fiber.

SUMMARY OF THE INVENTION

The present invention provides a method of producing a optical module, comprising:

a first step of fixedly mounting at least one soldering sheet on a base in place through spot welding; and a second step of fixedly mounting at least one carrier on said soldering sheet through soldering, a semiconductor laser diode for outputting a laser beam or a photodiode for receiving the laser beam being mounted on said carrier.

The present invention also provides a optical module comprising:

a base;

at least one soldering sheet fixedly mounted on said base in place through spot welding;

a semiconductor laser diode for outputting a laser beam; and a carrier on which said semiconductor laser diode is mounted, said carrier being fixedly mounted on said soldering sheet through soldering.

DETAILED DESCRIPTION

Several embodiments of the present invention will now be described in comparison with the prior art.

Figure 3:
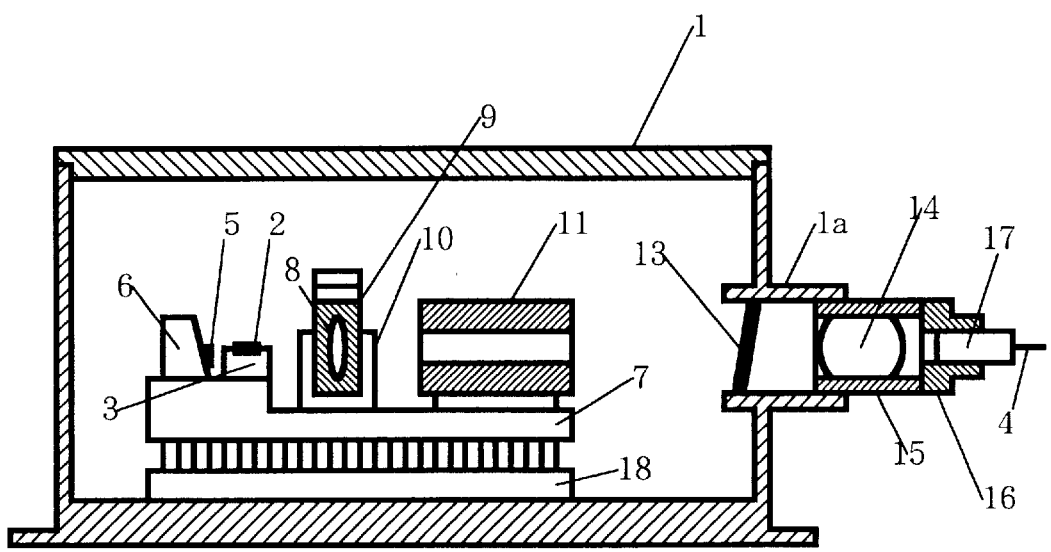
FIG. 3 is a side cross-sectional view illustrating an internal structure in the semiconductor laser module.
Figure 4:
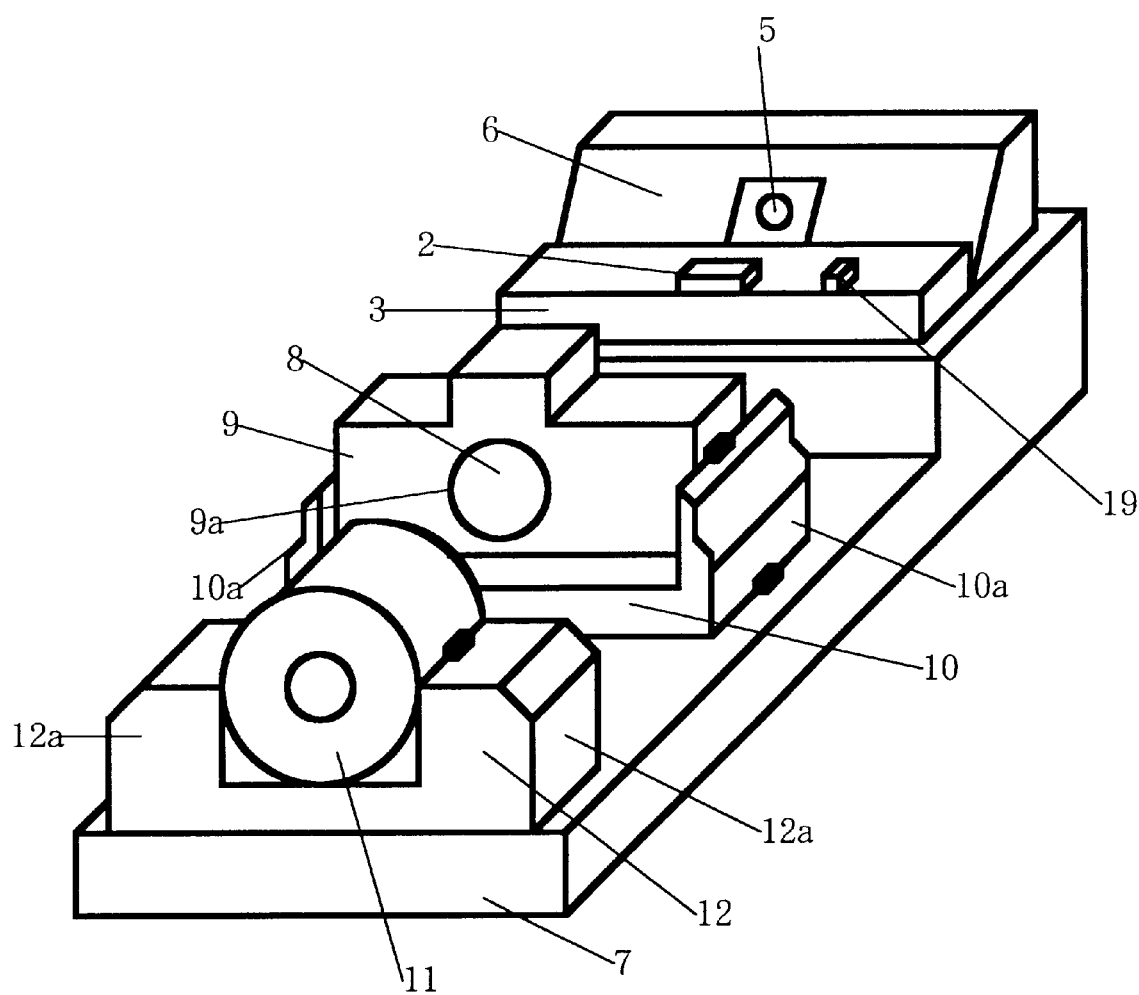
FIG. 4 is a perspective view illustrating first carrier, second carrier, collimating lens and optical isolator, all of which are mounted on a base.

FIG. 3 is a side cross-sectional view illustrating an internal structure in the semiconductor laser module while FIG. 4 is a perspective view illustrating first carrier, second carrier, collimating lens and optical isolator, all of which are mounted on a base.

Referring now to FIGS. 3 and 4, the semiconductor laser module comprises a hermetically sealed package 1; a semiconductor laser diode 2 located in the package 1 and adapted to output a laser beam; a first carrier 3 fixedly mounted on the semiconductor laser diode 2; an optical fiber 4 for receiving the laser beam from the semiconductor laser diode 2; a photodiode 5 for receiving a monitoring laser beam outputted from the semiconductor laser diode 2 at the rearward side (or the left side as viewed in FIG. 3); a second carrier 6 fixedly mounted on the photodiode 5; and a base 7 on which the first and second carriers 3, 6 are fixedly mounted through soldering. The base 7 is made of Cu—W alloy or the like and has a substantially L-shaped cross-section.

A collimating lens 8 for collimating the laser beam from the semiconductor laser diode 2 is located on the base 7 in front of the semiconductor laser diode 2 (or on the right side as viewed in FIG. 3). The collimating lens 8 is fitted into an aperture 9a which is formed through a lens holder 9 formed by a metal such as stainless steel or the like. The lens holder 9 is held by a first holding member 10 which is located on the base 7. The first holding member 10 includes a pair of first holding portions 10a which are formed thereon spaced apart from each other with a predetermined spacing and parallel to the optical axis. The lens holder 9 is held by mounting it between the pair of first holding portions 10a.

On installation, the first holding member 10 and lens holder 9 are first moved to and positioned in a position in which a desired collimated light beam is provided by the collimating lens 8. Thereafter, the lens holder 9 is fixedly mounted on the first holding member 10 through YAG laser welding. At the same time, the first holding member 10 is fixedly mounted on the base 7 through YAG laser welding.

An optical isolator 11 for defining the direction of light passage is located in front of the collimating lens 8. The optical isolator 11 is held by a second holding member 12 on the base 7. The second holding member 12 includes a pair of second holding portions 12a formed therein spaced apart from each other with a predetermined spacing and parallel to the optical axis. The optical isolator 11 is sandwiched and fixedly mounted between the pair of second holding portions 12a through YAG laser welding after the optical isolator 11 has been aligned with the collimating lens 8.

The package 1 includes a flange portion 1a formed therethrough on one side. The flange portion 1a houses a window 13 for receiving the beam passed through the optical isolator 11 and a condensing lens 14 for condensing the laser beam. The condensing lens 14 is held by a third holding member 15. A metallic slide ring 16 is fixedly mounted on the outer end of the third holding member 15 through YAG laser welding.

The optical fiber 4 is held by a metallic ferrule 17 which is fixedly mounted in the interior of the slide ring 16 through YAG laser welding.

The base 7 is fixedly mounted on a cooling device 18 which is fixedly mounted on the internal bottom of the package 1. The cooling device 18 is designed to cool the semiconductor laser diode 2 and includes a Peltier device. Any increase of temperature due to the heat from the semiconductor laser diode 2 is sensed by a thermistor 19 (see FIG. 4) which is located on the first carrier 3. The cooling device 18 is controlled such that the temperature sensed by the thermistor 19 will be maintained constant. Thus, the laser output of the semiconductor laser diode 2 can be stabilized.

The laser beam outputted from the forward side of the semiconductor laser diode 2 is collimated by the collimating lens 8 and then enters the condensing lens 14 through the optical isolator 11 and window 13. The laser beam condensed at the condensing lens 14 enters the optical fiber 4 held by the ferrule 17, from which the laser beam is fed out.

On the other hand, the monitoring laser beam outputted from the rearward side of the semiconductor laser diode 2 is received by the photodiode 5. The amount of light at the photodiode 5 is calculated to regulate the wavelength of light emission in the semiconductor laser diode 2.

Figure 5:
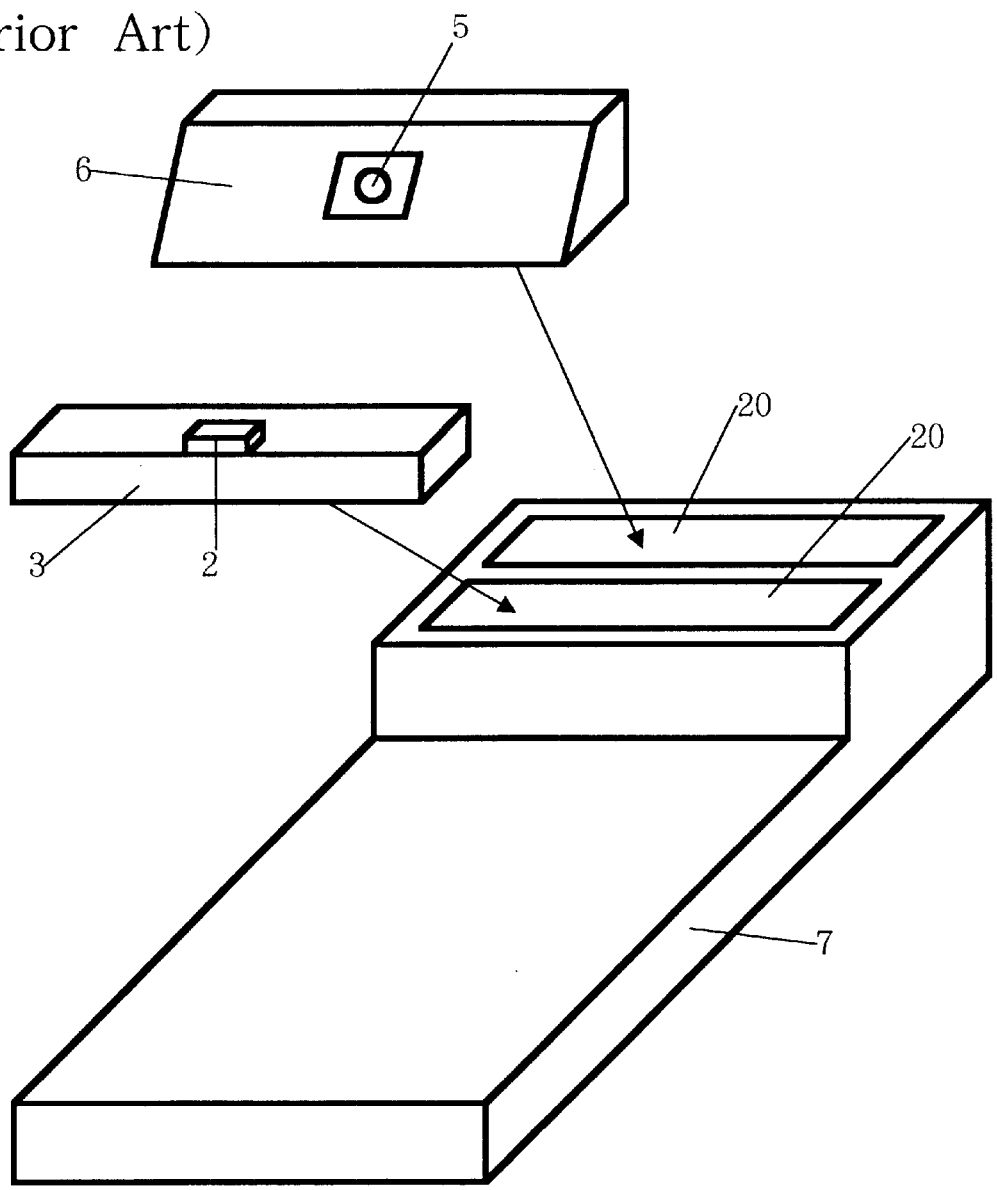
FIG. 5 illustrates a prior art step of fixedly mounting the first and second carriers on the base in the semiconductor laser module producing process.

FIG. 5 illustrates a prior art step of fixedly mounting the first and second carriers on the base in the semiconductor laser module producing process.

The first carrier 3 is fixedly mounted on the semiconductor laser diode 2. The photodiode 5 is fixedly mounted on the second carrier 6.

Next, the joining face (or bottom face) between the first and second carriers 3, 6 and the base 7 is plated with Au. The top of the base 7 is also plated with Au.

A soldering material 20 such as Au/Sn or the like is fed onto the joining sections on the base 7.

After the first and second carriers 3, 6 have been joined on the base 7, they are heated to perform the soldering fixation.

In the prior art, if it is wanted to fed the soldering material 20 onto the joining sections on the base 7, it is required that an appropriate amount of the soldering material 20 is properly supplied in place. This raised a problem in that time required to produce the semiconductor laser module increased.

Figure 1:
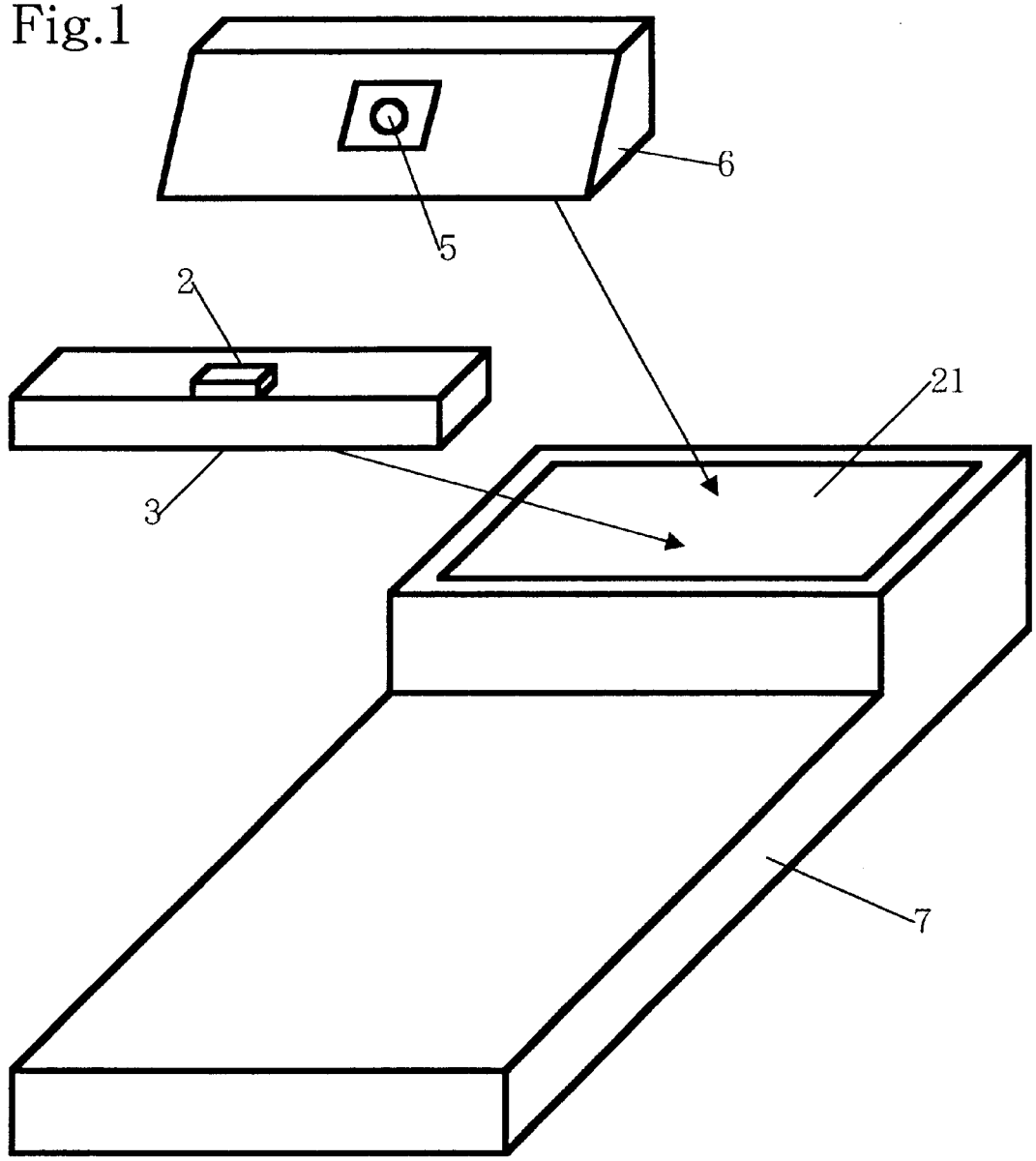
FIG. 1 is a perspective view of a first embodiment of the present invention.

FIG. 1 is a perspective view of a first embodiment of the present invention. As will be apparent from FIG. 1, the first embodiment of the present invention provides a soldering sheet 21 fixedly pre-mounted on the base 7 for soldering the first and second carriers 3, 6 on the base 7 in place.

To pre-fix the soldering material on the base 7, there may be considered use of vapor deposition or sputtering. However, it is very difficult that the soldering material is later worked into a desired configuration, since the parts used in the semiconductor laser module are of complicated configuration. To fix the soldering material to the joining sections, the first embodiment uses the soldering sheet 21 of a predetermined configuration fixedly mounted on the base 7 through spot welding.

A detailed procedure of fixedly mounting the first and second carriers 3, 6 on the base 7 will now be described. First of all, the semiconductor laser diode 2 is fixedly mounted on the first carrier 3 and the photodiode 5 is fixedly mounted on the second carrier 6.

Next, the joining boundary (or bottom face) between the first and second carriers 3, 6 and the base 7 is plated with Au. The top of the base 7 is also plated with Au.

Subsequently, the first and second carriers 3, 6 are joined to the soldering sheet 21 that has previously been fixedly mounted on the base 7. Thereafter, such an assembly is heated to perform the soldering fixation. Such a process is referred to the soldering process.

Figure 2:
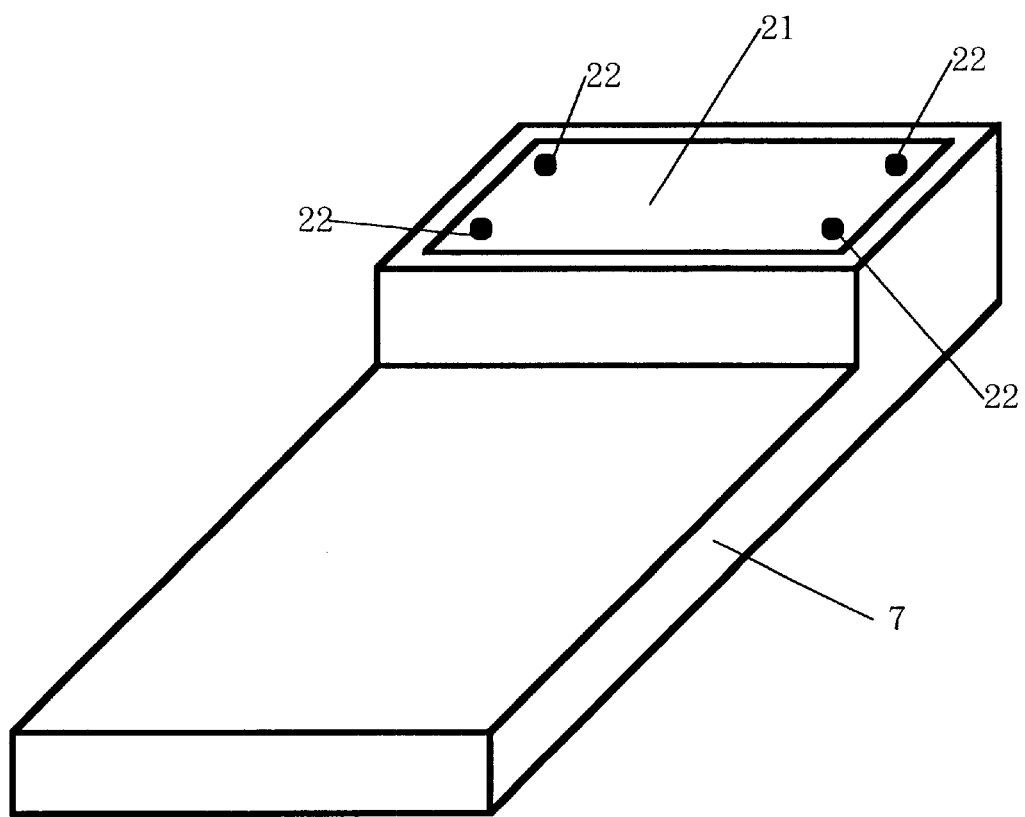
FIG. 2 is a perspective view of a second embodiment of the present invention.

In the soldering process, the soldering sheet 21 is mounted on the base 7 through spot welding. On the spot welding, electrodes are applied to the soldering sheet 21 at several points (four welding points 22 being shown in FIG. 2). As the electric current is applied to the electrodes, the soldering sheet 21 is locally heated. At the same time, the electrodes are pressed against the soldering sheet 21. Alternatively, the soldering sheet may locally be heated and fused at several welding points by the use of laser beam spots.

Since the spot welding can locally heat and weld the soldering sheet 21 at pre-selected welding points, the manufacturing process can be improved both in time and cost.

The present invention is not limited to the aforementioned embodiments, but may be carried out in any of various other forms without departing from the spirit and scope of the invention as defined in the appending claims. For example, a separate soldering sheet 21 may be applied independently to each of the first and second carriers, although the embodiments have been described as to the use of a single soldering sheet 21 for soldering the first and second carriers 3, 6 on the base 7 to improve the manufacturing process both in time and cost.

What is claimed is:

1. A method of producing a optical module, comprising:
   a first step of fixedly mounting at least one soldering sheet on a base in place through spot welding; and
   a second step of fixedly mounting at least one carrier on said soldering sheet through soldering, a semiconductor laser diode for outputting a laser beam or a photodiode for receiving the laser beam being mounted on said carrier.

2. The method according to claim 1 wherein only a single soldering sheet is used to fix two carriers, a carrier on which a semiconductor laser diode is mounted and another carrier on which a photodiode for receiving a mentoring laser beam outputted from the back face of said semiconductor laser diode is mounted.

3. The method according to claim 1 wherein said spot welding is carried out by locally applying electrodes to the soldering sheet.

4. The method according to claim 1 wherein said spot welding is carried out by locally irradiating said soldering sheet with laser beams.

5. The method according to claim 1 wherein said soldering sheet is made of a soldering material of Au—Sn.

6. A optical module comprising:
   a base;
   at least one soldering sheet fixedly mounted on said base in place through spot welding;
   a semiconductor laser diode for outputting a laser beam; and
   a carrier on which said semiconductor laser diode is mounted, said carrier being fixedly mounted on said soldering sheet through soldering.

7. The optical module according to claim 6 wherein said soldering sheet is made of a soldering material of Au—Sn.

8. The optical module according to claim 6, further comprising a second carrier on which said photodiode is mounted, said second carrier being fixedly mounted on said soldering sheet through soldering.

* * * * *